United States Patent [19]

Hilger

[11] Patent Number: 4,950,580

[45] Date of Patent: Aug. 21, 1990

[54] PROCESS FOR PRODUCTION OF A PHOTOPOLYMERIZABLE RECORDING MATERIAL

[75] Inventor: Manfred Hilger, Konz, Fed. Rep. of Germany

[73] Assignee: Hoechst Aktiengesellschaft, Frankfurt, Fed. Rep. of Germany

[21] Appl. No.: 89,034

[22] Filed: Aug. 24, 1987

Related U.S. Application Data

[63] Continuation of Ser. No. 840,051, Mar. 17, 1986, abandoned.

[30] Foreign Application Priority Data

Mar. 21, 1985 [DE] Fed. Rep. of Germany ....... 3510219

[51] Int. Cl.$^5$ .............................................. G03C 1/76
[52] U.S. Cl. .................................... 430/281; 430/287; 430/288; 430/910; 430/327; 520/121; 525/378
[58] Field of Search ............... 430/281, 327, 287, 288, 430/910; 522/121; 525/378

[56] References Cited

U.S. PATENT DOCUMENTS 3,085,897  4/1963  Priest .
3,144,331  8/1964  Thommes ........................... 430/494
3,168,404  2/1965  McGraw .
3,469,982  9/1969  Celeste ................................ 96/35.1
3,930,865  1/1976  Faust et al. ......................... 96/86 P
4,634,644  1/1987  Irving .

FOREIGN PATENT DOCUMENTS 0146505  3/1979  European Pat. Off. .
1388809  3/1975  United Kingdom .

Primary Examiner—Jack P. Brammer
Attorney, Agent, or Firm—Foley & Lardner, Schwartz, Jeffery, Schwaab, Mack, Blumenthal & Evans

[57] ABSTRACT

A process for the production of a photopolymerizable recording material comprised of a layer support and a solid, dry photopolymerizable layer which contains, as the essential constituents: (a) a polymeric binder which is insoluble in water and soluble in aqueous-alkaline solutions, (b) an acrylic or methacrylic acid ester of a polyhydric alcohol, which is polymerizable by a free-radical process, and (c) an initiator capable of photo-inducing the free-radical polymerization, in which process the photopolymerizable layer is treated with ammonia or an oxidizing agent. This treatment substantially reduces the cold flow of the layer.

6 Claims, No Drawings

PROCESS FOR PRODUCTION OF A PHOTOPOLYMERIZABLE RECORDING MATERIAL

This application is a continuation, of application Ser. No. 840,051, filed Mar. 17, 1986, now abandoned.

BACKGROUND OF THE INVENTION

The present invention relates to a process for the production of a photopolymerizable recording material, in particular a dry photoresist material comprised of a layer support and a solid, dry photopolymerizable layer which contains, as the essential constituents, (a) a polymeric binder which is insoluble in water and soluble in aqueous-alkaline solutions, (b) an acrylic or methacrylic acid ester of a polyhydric alcohol, which is polymerizable by a free-radical process, and (c) an initiator capable of photo-inducing the free-radical polymerization.

The free surface of the photopolymerizable layer is preferably covered with a thin polyethylene film.

Materials of the above-mentioned type are disclosed, for example, in U.S. Pat. No. 3,469,982, and are extensively used in the production of printed circuits and in similar applications.

The photoresist layers of these materials must be adapted for dry transferring to another support material, for example, a copper plate, with the application of pressure and usually also with heating. Therefore, the photoresist layer must be at least thermoplastically deformable, preferably even plastically deformable at ambient temperature, and it should have a particular tackiness. Materials showing these processing characteristics to an optimum degree present certain problems during storage and transport in the unexposed state, since their photoresist layers invariably tend to undergo some cold flow which becomes apparent when the material is stored in the form of a roll. The photoresist layer then emerges between the film layers at the end faces of the roll and causes the wound-up layers to stick together. In an attempt to solve this problem, the composition of the photoresist layer, in particular the nature of the thermoplastic binder, has been modified to raise the flow temperature of the layer. This way of proceeding, which is described, for example, in German Offenlegungsschrift No. 23 63 806, is limited by the fact that the brittleness of the photo-crosslinked layer increases with a rising flow temperature of the unexposed layer, such that processing of the exposed material is rendered difficult.

Another solution to the problem is described in German Patent No. 23 45 120. According to this publication, the edges of the photoresist layer are light-hardened, so that the layer can no longer be squeezed out. This method has the disadvantage that, during processing of the respective material, light-sensitive substance is lost in the edge zones, since a particular safe distance must be allotted to ensure that any partly polymerized portions of the layer are excluded from the subsequent exposure and developing.

To overcome this problem, it is proposed in German Patent Application No. P 34 37 453.1 to cover the end faces of the dry resist rolls by means of glued-on covering disks, in order to prevent any photopolymerizable layer portions from being squeezed out during storage.

SUMMARY OF THE INVENTION

It is accordingly an object of the present invention to provide a process for the production of a photopolymerizable material of the type described at the outset, which provides for an effective prevention of cold flow.

It is a particular object of the invention to provide such a process which avoids the need to substantially change the composition of the layer constituents.

Still another object of the invention is to provide such a process in which it is unnecessary to perform an additional pre-exposure step.

It is also an object of the present invention to provide an improved photopolymerizable material which is resistant to cold flow upon storage.

In accomplishing these objects, there is provided, in accordance with one aspect of the present invention, a process for the production of a photopolymerizable recording material comprising the steps of providing a layer support; coating the layer support with a solid, dry photopolymerizable layer which contains, as the essential constituents, (a) a polymeric binder which is insoluble in water and soluble in aqueous-alkaline solutions, (b) an acrylic or methacrylic acid ester of a polyhydric alcohol, which is polymerizable by a free-radical process, and (c) an initiator capable of photo-inducing the free-radical polymerization; and treating the photopolymerizable layer with an amount of ammonia or an oxidizing agent sufficient to reduce the cold flow of the solid, dry photopolymerizable layer.

There has also been provided in accordance with another aspect of the present invention an improved photopolymerizable recording material which is resistant to cold flow and which is produced by the above-described process.

Further objects, features and advantages of the present invention will become apparent from the detailed description of preferred embodiments which follows.

DETAILED DESCRIPTION OF PREFERRED EMBODIMENTS

In one embodiment, the treatment with ammonia or an oxidizing agent can be effected by adding a solution of, e.g., ammonia, in water or in an organic solvent, to the coating solution and mixing the two solutions homogeneously. The amount of added ammonia should advantageously be selected such that it corresponds to about 10% to 100%, preferably about 15% to 60%, of the stoichiometric amount required to neutralize the acid groups, predominantly the carboxyl groups of the binder, which are contained in the photopolymerizable mixture. The reaction manifests itself in a strongly increased viscosity of the coating solution.

It is also possible according to another embodiment to perform the treatment with ammonia or oxidizing agent by applying it only to the edges of the resist film, and this is done preferably after the coating and winding up of the finished dry resist film. In this case, the end faces of the roll are simply wetted with a solution of ammonia or oxidizing agent, for example, by wiping with a sponge or cloth soaked with the solution and subsequent drying. Only the edge zones of the photopolymerizable layer are reacted in this process. In contrast to the known light-hardening methods, this treatment does not affect the photosensitivity and developability of these edge zones. Only the flow properties of the zones are considerably impaired. The treatment with ammonia even brings about a certain increase in photosensitivity and improved image differentiation when the photoresists are processed according to known methods.

If an oxidizing agent is used for the treatment, both of the above-described procedures can in principle be employed, with quite a number of oxidizing agents. However, some oxidizing agents tend to cause an irreversible, undesired impairment of the properties and behavior of the photopolymerizable layer. Therefore, the treatment with oxidizing agents preferably is restricted to a treatment of the end faces of the roll. The oxidizing agent is also applied in the form of an aqueous or organic solution, with preference being given to an aqueous solution. Examples of suitable oxidizing agents are potassium permanganate, sodium peroxide, hydrogen peroxide and ammonium bichromate. The optimum concentration and amount of the solution employed in each case can be determined by simple tests. If desired, the wetting of the end faces of the roll with the solution can be followed by a short heat treatment, for example, with infrared radiation, in order to accelerate the drying process and to enhance the diffusion and action of the oxidizing agent. If it is desired to treat the entire photopolymerizable layer with an oxidizing agent, it is a routine matter to determine by simple tests whether any particular oxidizing agent is suitable or whether it adversely impairs the properties and behavior of the photopolymerizable layer.

The dry resist materials, which are treated by the process according to this invention, are known in the art and are described, for example, in German Offenlegungsschriften No. 20 64 079, No. 23 63 806, No. 21 23 702, No. 28 22 190 and No. 31 34 123. These materials generally comprise a dimensionally stable support film, a photopolymerizable layer and a covering film. The support film is, for example, a polyester film and preferably has a thickness in the range from about 15 to 30 /μm, and the covering film has a thickness from about 5 to 25 /μm. The principal constituents of the photopolymerizable layer comprise a thermoplastic polymeric binder, polymerizable compounds, which are preferably acrylic or methacrylic acid esters of polyhydric aliphatic hydroxyl compounds, and a photopolymerization initiator. Other customary constituents may comprise polymerization inhibitors, dyes, pigments, plasticizers and crosslinking agents. The thickness of the layer is generally in the range between about 10 and 70 /μm, preferably between about 15 and 40 /μm. The disclosures of these publications and the above-cited background documents are hereby incorporated by reference.

In the following examples, preferred embodiments of the invention are described. Parts by weight (p.b.w.) and parts by volume (p.b.v.) are related as g to cm$^3$. Unless otherwise indicated, percentages and quantitative ratios relate to units by weight.

Example 1

A solution of
9 p.b.w. of a terpolymer of n-hexylmethacrylate, methacrylic acid and styrene (60 : 30 : 10) having a mean molecular weight of about 35,000,
6.4 p.b.w. of a polymerizable oligourethane, obtained by reacting 11 moles of 2,2,4-trimethyl-hexamethylene diisocyanate first with 10 moles of triethylene glycol and then with 2 moles of hydroxyethylmethacrylate, and
3.9 p.b.w. of the ester obtained from 2,6-dihydroxybenzoic acid and diethylene glycol-mono-2-ethylhexyl ether, in
45 p.b.w. of butanone and
4.5 p.b.w. of water
is mixed, with vigorous stirring, within 30 minutes with 1.4 p.b.v. of a 16% strength aqueous ammonia solution.

This increases the viscosity of the solution from 30 mm$^2$/s to 70 to 80 mm$^2$/s.

Thereafter,
0.35 p.b.w of 9-phenyl-acridine and
0.035 p.b.w. of a blue azo dye obtained by coupling 2,4-dinitro-6-chloro-benzene-diazonium salt with 2-methoxy-5-acetylamino-N-cyanoethyl-N-hydroxethylaniline
are added and dissolved with stirring. The solution is then spin-coated onto a 25 /μm thick, biaxially oriented and heat-set polyethylene terephthalate film in such a way that a dry layer weight of 28 g/m$^2$ is achieved.

A sample of the dry resist film obtained is placed in a drying oven heated to a temperature of 50° C. and loaded with a weight of 1,000 g. Virtually no deformation of the layer is observed even after 16 hours. Only a slight impression caused by the relief-type number marked at the bottom of the weight is visible in the resist layer.

Another sample of the resist film is laminated in the customary manner, employing a laminating apparatus and applying heat and pressure, onto a cleaned, copper-clad phenol resin laminate board and exposed through a continuous-tone step wedge using conventional exposure equipment. After the exposure, the polyester film is peeled off, and the layer is developed with a 0.8% strength solution of Na$_2$CO$_3$ in a spray developing device. Five fully crosslinked wedge steps are obtained.

For comparative reasons, a dry resist film is produced from the same constituents, which differs from the above-described film only in that no ammonia solution is added in the preparation of the coating solution. After being loaded with a weight of 1,000 g for 16 hours at a temperature of 50° C., the photoresist layer exhibits strong circular impressions, which have formed along the edge zone of the weight; the type number marked on the weight is completely impressed into the layer down to the support film and is visible as a white pattern in the blue layer.

Another sample of the comparative film is exposed and developed as described above. Four fully crosslinked wedge steps are obtained.

Example 2

A dry resist film is prepared as described in Example 1, but without treating the coating solution with an ammonia solution. After drying, the photoresist layer is covered, in a continuous process, with a 12 /μm thick polyethylene film by lamination. Two rolls are produced, each of which is 45 cm wide and 200 m long. The end faces of one roll are wiped over with a dabber soaked with 16% strength aqueous ammonia solution, and are then dried. The two rolls are then stored in a drying cabinet at a temperature of 45° C. for 5 days. After this period, the edges of the roll, which was treated in accordance with this invention, are practically unchanged. No layer components have emerged from the end faces. An examination of the end faces of the other, untreated roll shows that in some places considerable amounts of layer substance have emerged and spread across the individual layers of the roll. When the roll is being unwound in the laminating device and also when the covering film is being separated from the photoresist layer, this squeezed-out layer substance gives rise to trouble, such as tearing of the photoresist layer or sticking of the photoresist layer to the covering film.

Example 3

A roll of dry resist film is prepared as indicated in Example 2. As described in Example 2, the end faces of the roll are then treated with a solution which in this case is a 1% strength solution of potassium permanganate. Storage of the roll in a drying cabinet leads to similar results as in Example 2, i.e., virtually no layer substance emerges from the end faces treated with the oxidizing agent.

What is claimed is:

1. A process for the production of a photopolymerizable recording material comprising the steps of
   (1) providing a layer support;
   (2) coating the layer support with a solid, dry photopolymerizable layer which consists essentially of an admixture of
      (a) a water-insoluble polymeric binder containing carboxyl acid groups in an amount such that the binder becomes soluble in aqueous-alkaline solutions,
      (b) an acrylic or methacrylic acid ester of a polyhydric alcohol, which is polymerizable by a free-radical process, and
      (c) an initiator capable of photo-inducing the free-radical polymerization; and
   (3) contacting the admixture with an amount of ammonia, wherein said amount (i) is sufficient to reduce the cold flow of the solid, dry photopolymerizable layer and (ii) corresponds to between about 10% and 100% of the stoichiometric amount required to neutralize said carboxyl acid groups.

2. A process as claimed in claim 1, wherein step (3) comprises mixing an aqueous solution of ammonia with the admixture prior to step (2).

3. A process as claimed in claim 1, wherein step (3) comprises treating only the edges of the photopolymerizable layer with a solution comprised of ammonia.

4. A process as claimed in claim 3, further comprising the step of winding-up the recording material into a roll having end faces, and wherein said step (3) comprises treating the end faces of said roll.

5. A process as claimed in claim 2, wherein from about 0.1 to 1.0 mole of ammonia is mixed per one equivalent of acid groups contained in the admixture.

6. A process as claimed in claim 1, wherein said amount of ammonia corresponds to between about 15% and 60% of said stoichiometric amount.

* * * * *